United States Patent [19]

Brihier

[11] 4,178,541
[45] Dec. 11, 1979

[54] APPARATUS FOR TESTING THE OPERATION OF A DEVICE CONTROLLING THE IGNITION OF AN INTERNAL COMBUSTION ENGINE

[75] Inventor: Gerard C. C. Brihier, Ollainville, France

[73] Assignee: Facom, Morangis, France

[21] Appl. No.: 911,238

[22] Filed: May 31, 1978

[30] Foreign Application Priority Data

Jun. 2, 1977 [FR] France ................................ 77 16872
Jun. 2, 1977 [FR] France ................................ 77 16873
Jun. 2, 1977 [FR] France ................................ 77 16875

[51] Int. Cl.² ........................................... F02P 17/00
[52] U.S. Cl. .................................... 324/385; 73/118; 324/392
[58] Field of Search ................. 324/15, 16 R, 16 T; 73/118, 117.3, 119 R

[56] References Cited

U.S. PATENT DOCUMENTS

| | | | |
|---|---|---|---|
| 3,210,653 | 10/1965 | Williams et al. | 324/16 R |
| 3,753,108 | 8/1973 | Eberle | 324/16 R |
| 3,883,795 | 5/1975 | Klein et al. | 324/16 R |
| 4,052,663 | 10/1977 | Lindsey | 324/16 R |

Primary Examiner—Stanley T. Krawczewicz

[57] ABSTRACT

The apparatus for testing a device controlling the ignition of an engine comprises rotary driving means for driving the device and simulating the driving of the device in normal operation; an angular encoder mechanically coupled to the driving means for providing a series of clock pulses the frequency of which is a function of the speed of rotation of the driving means; means for producing a pulse signal representing the ignition initiating signal delivered by the device when it operates in the course of its use with the internal combustion engine; at least one circuit for measuring an angular parameter of operation of the device, the measuring circuit being connected to the encoder and to the pulse signal producing means for producing a measurement signal formed by a series of measurement pulses each of which occurs respectively in the course of a revolution of the driving means, each pulse representing the angular parameter to be measured and a display device for displaying the number of clock pulses occurring per revolution during a measurement pulse.

26 Claims, 10 Drawing Figures

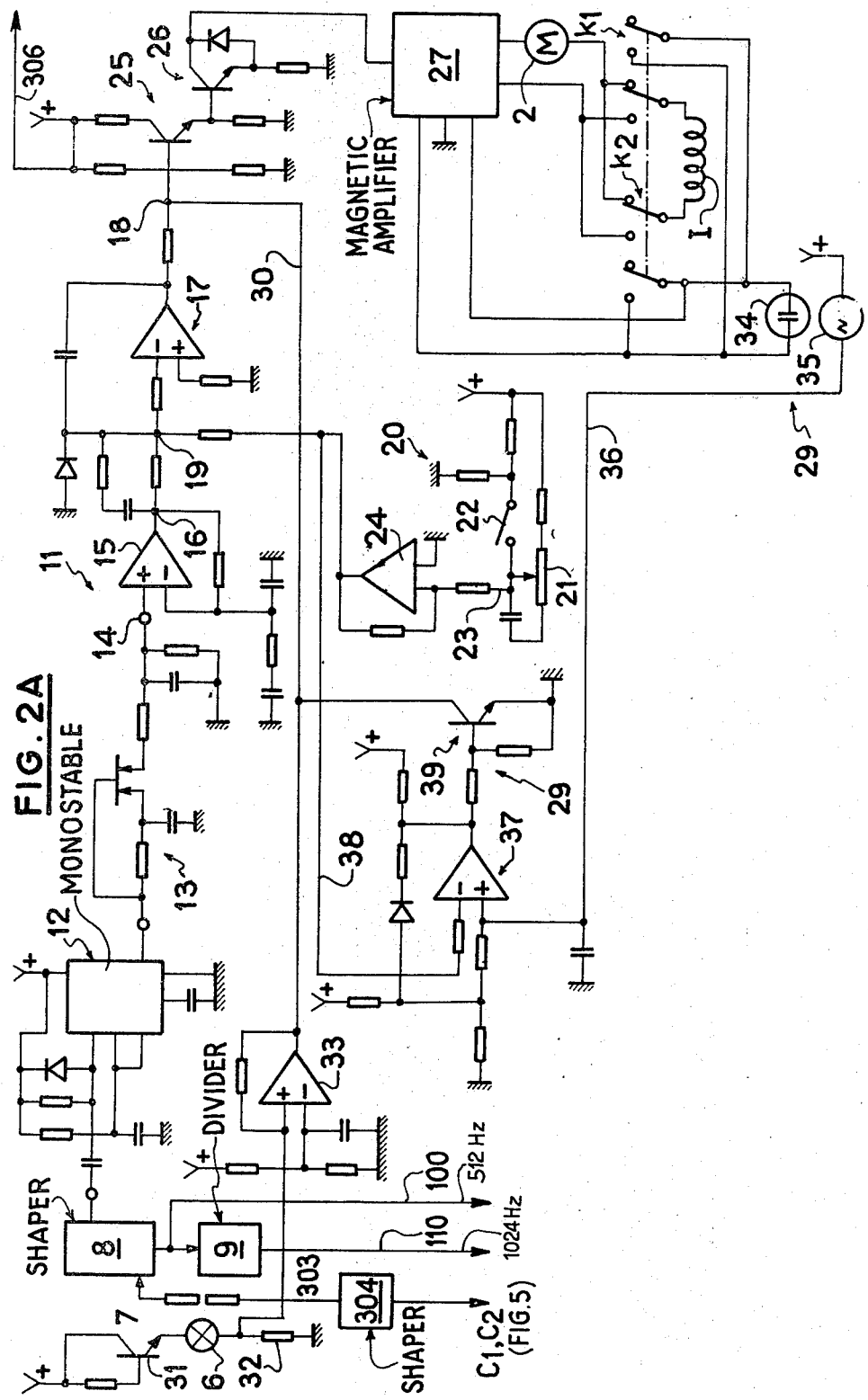

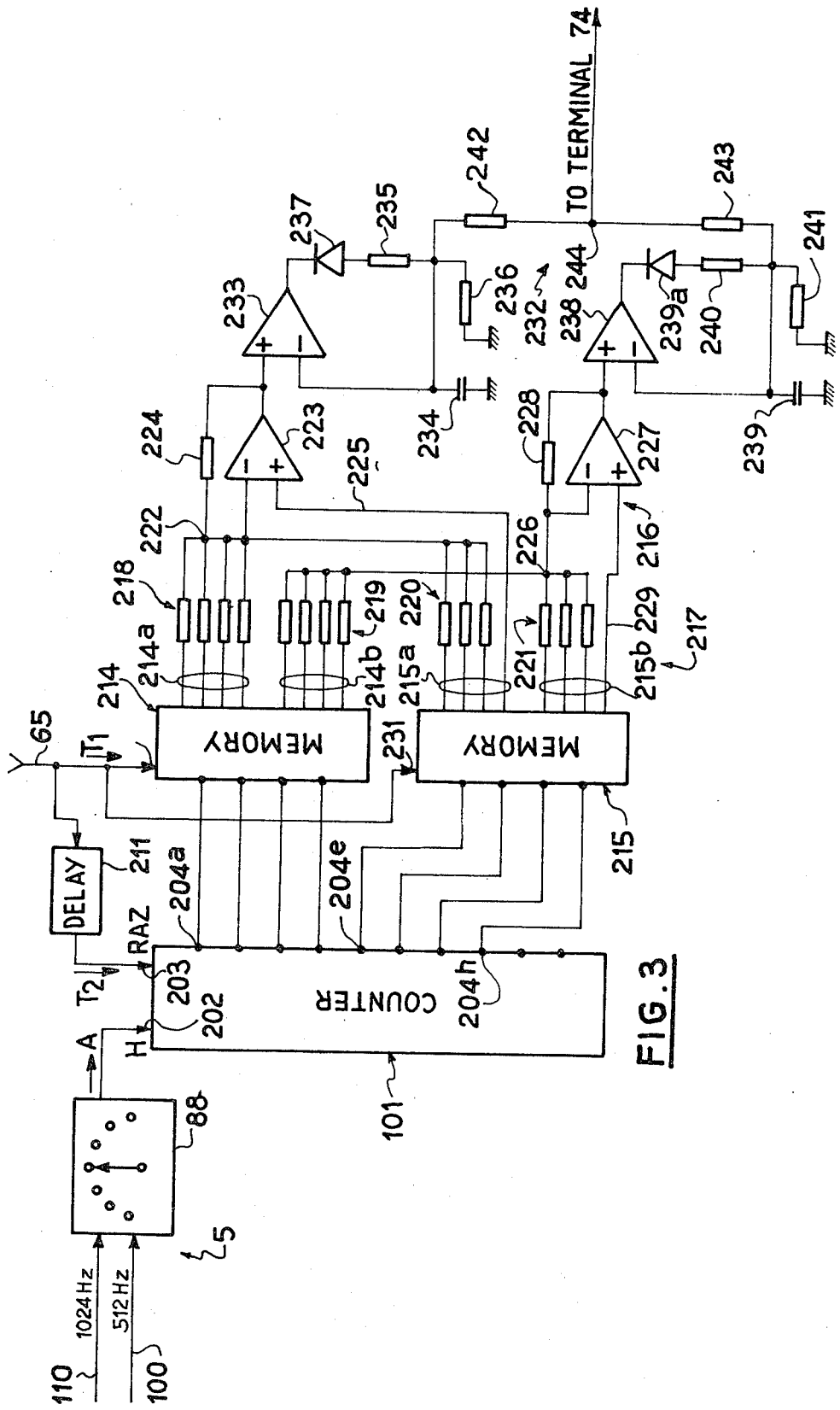

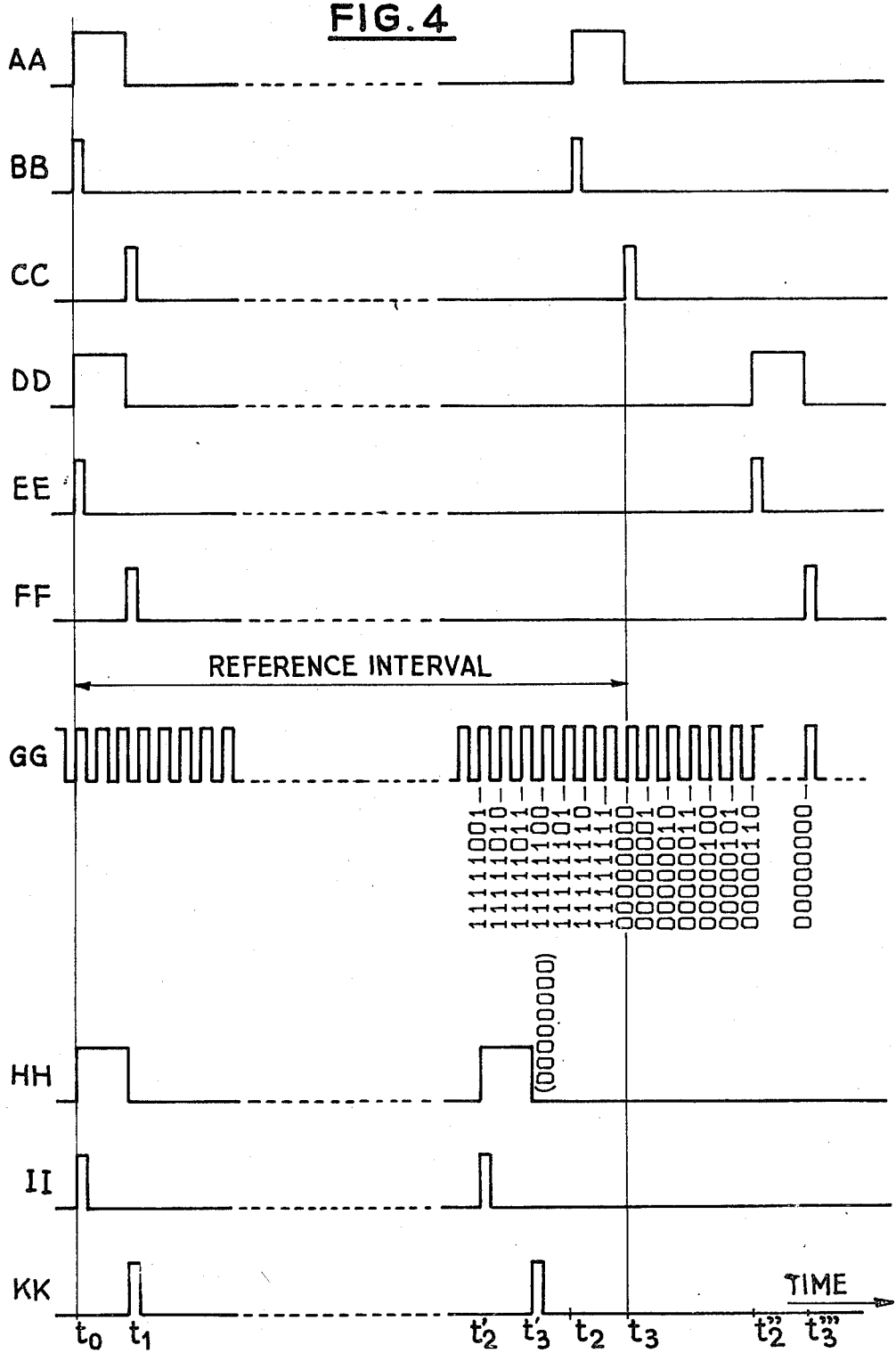

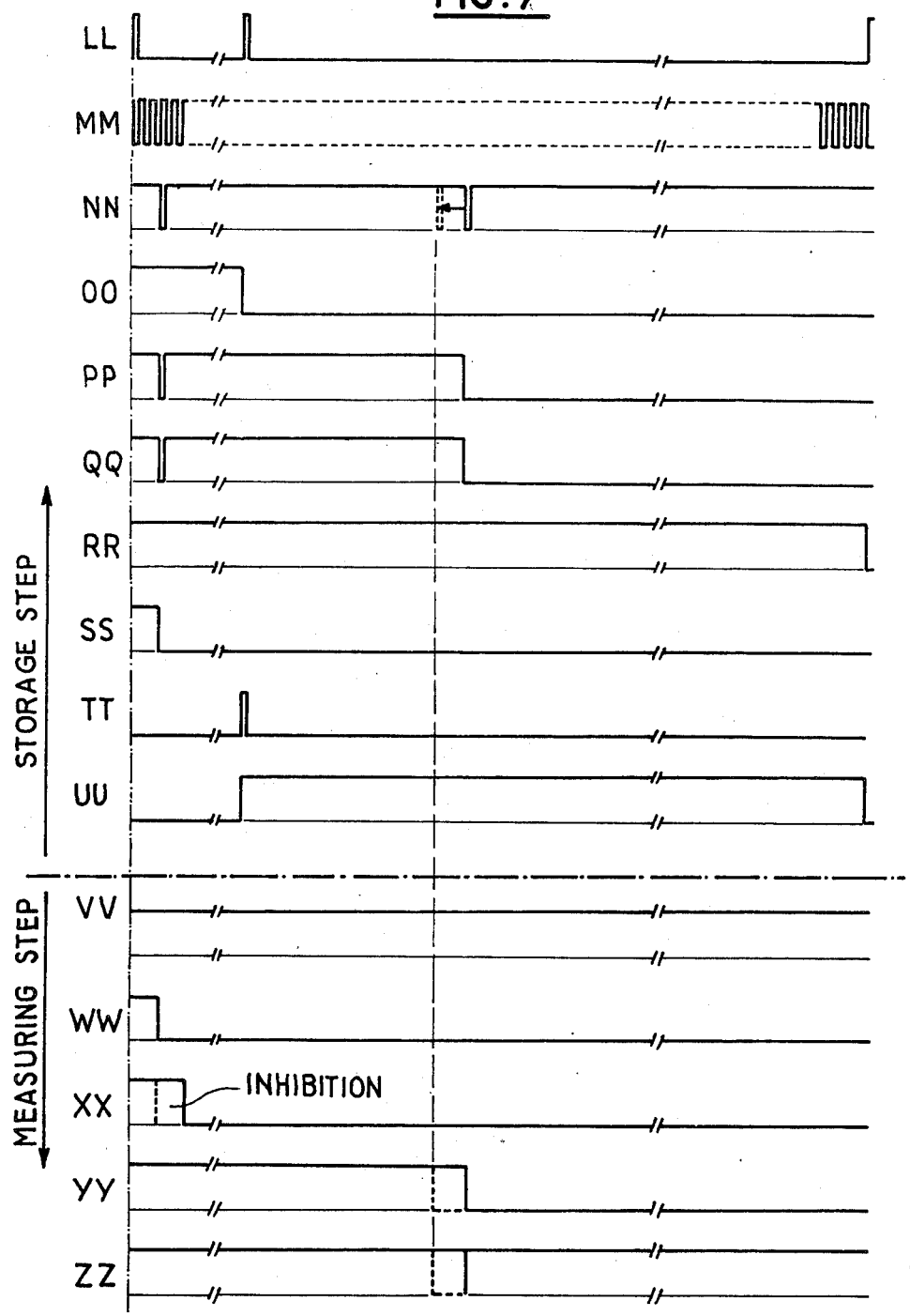

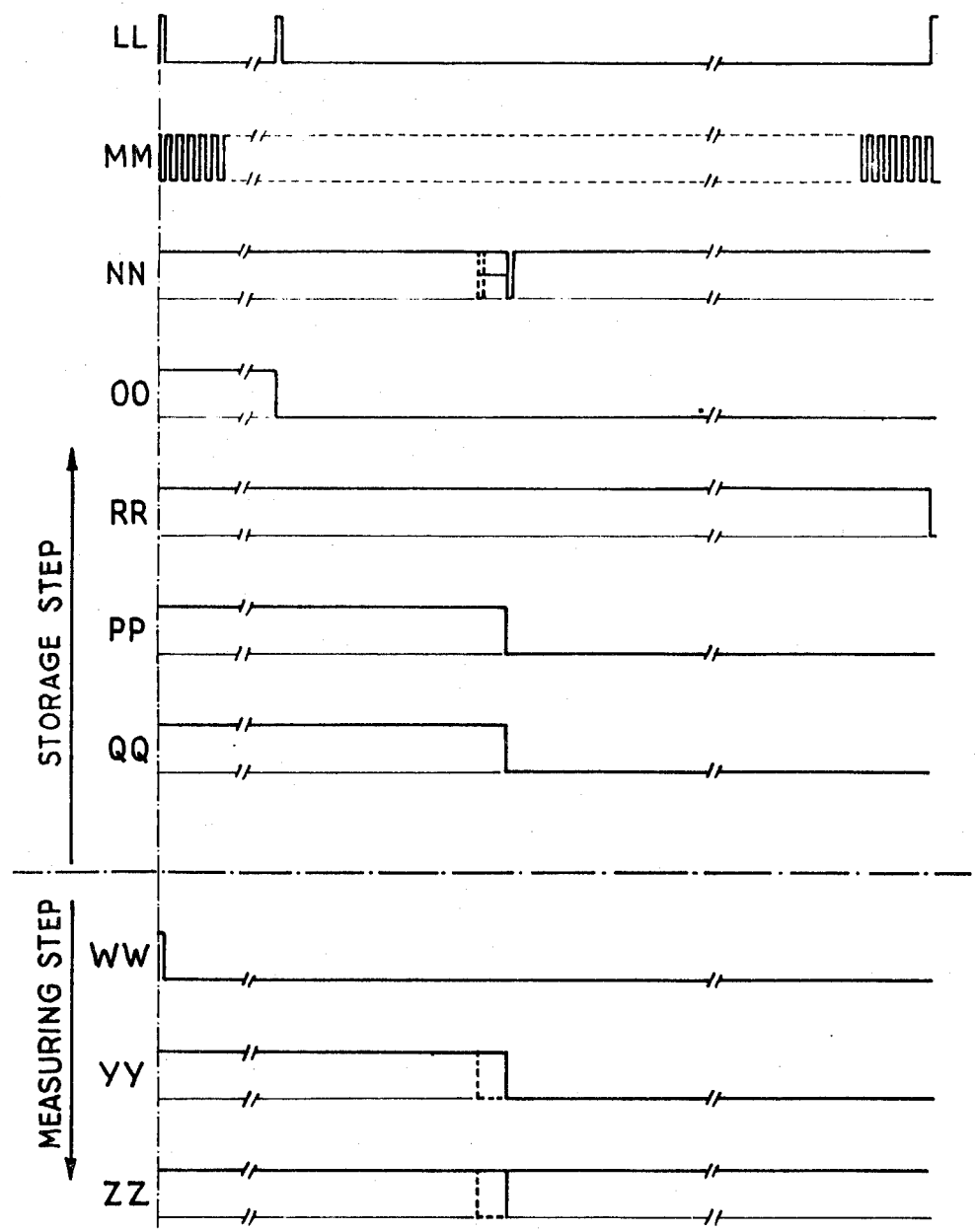

APPARATUS FOR TESTING THE OPERATION OF A DEVICE CONTROLLING THE IGNITION OF AN INTERNAL COMBUSTION ENGINE

The present invention relates to apparatus for testing auxiliary equipment of internal combustion engines employed in particular in servicing and repairs workshops for automobile vehicles.

More particularly, the invention concerns an apparatus for testing the operation of auxiliary equipment which, in an internal combustion engine, controls the ignition cycle for the fuel mixture in the cylinders, such as for example ignition distributors for the electric ignition and injection pumps.

An object of the invention is to provide an apparatus which is fully automatic and permits testing all the essential parameters of the aforementioned equipment.

According to the invention, there is provided an apparatus for testing the operation of a device initiating the ignition of an internal combustion engine, such as an ignition distributor or an injection pump, comprising rotary driving means for driving said device and simulating the driving thereof in normal operation; an angular encoder mechanically coupled to said driving means for providing a series of clock pulses the frequency of which is a function of the speed of rotation of said driving means; means for producing a pulse signal representing the ignition initiating signal furnished by said control device when it operates in the course of its use with the internal combustion engine; at least one circuit for measuring an angular parameter of operation of said device, said measuring circuit being connected to said encoder and to said pulse signal producing means for producing a measurement signal comprising a series of measurement pulses each of which appears respectively in the course of a revolution of said driving means, each pulse representing said angular parameter to be measured; and a display device for displaying the number of clock pulses appearing per revolution during a measurement pulse.

Further features and advantages of the invention will be apparent from the ensuing description with reference to the accompanying drawings which are given solely by way of example and in which:

FIGS. 2A, 2B and 2C represent a detailed diagram of this apparatus;

FIG. 3 represents a detailed diagram of a circuit for measuring the dissymmetry of the cam employed in the diagram of FIGS. 2A, 2B and 2C;

FIG. 4 represents a diagram of the waveforms appearing at the outputs of certain circuits of FIG. 3;

Figure 1:
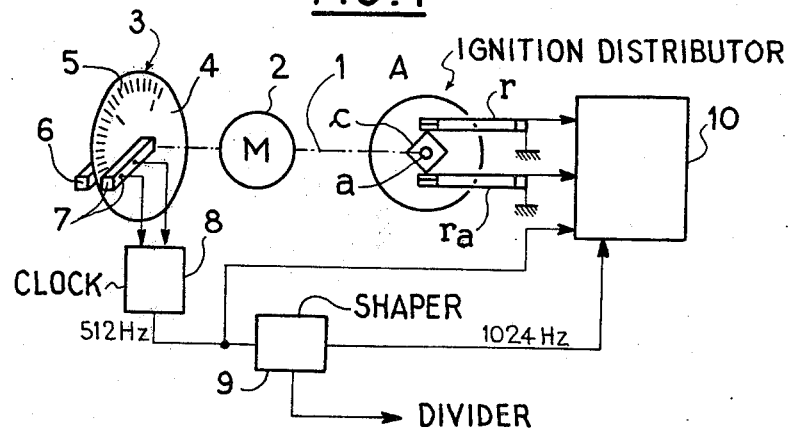
FIG. 1 is a very simplified diagram of an apparatus for testing an ignition distributor for electrical ignition.

FIG. 1 represents very diagrammatically an apparatus for testing the operation of a device controlling the ignition of an internal combustion engine, which, in the presently-described embodiment, is of the electrical type. However, it must be understood that the invention is also applicable to other devices controlling the ignition, such as for example injection pumps provided suitable adaptation circuits known to those skilled in the art are inserted in the testing device.

Such an ignition distributor comprises in the known manner a case in which is rotatably mounted a shaft a adapted to be driven in rotation, in normal operation, by the internal combustion engine on which the ignition distributor is mounted. Keyed on this shaft is a cam c the high parts of which are adapted to control a contact breaker r, and possibly a contact breaker $r_a$ depending on the type of engine with which the ignition distributor A is associated. In the course of the rotation of the shaft a, the cam c periodically closes one and/or the other contact breaker r or $r_a$ so as to control the electric ignition circuit and in particular the coil of this circuit.

The apparatus according to the invention is adapted to test the operation of such an ignition distributor A which is for this purpose removed from the engine with which it is associated and mounted on the apparatus in question in such manner that its shaft a and its cam c are rigid with the shaft 1 of an electric drive motor 2 which is secured to a support (not shown) of the apparatus and with respect to which the case of the distributor A may also be fixed. Consequently, the motor 2 permits a simulation of the driving to which the shaft a of the distributor is normally subjected during the operation of the internal combustion engine.

It is also known that, when the speed of an internal combustion engine varies, an "advanced ignition" is required to ensure a satisfactory combustion in the engine. For this purpose, the contact breakers r and $r_a$ are mounted on a support the angular position of which may be modified relative to that of the shaft a the position of which is related to that of the crankshaft of the internal combustion engine. This ignition advance increases with the speed of the internal combustion engine or, in other words, it increases with the speed of rotation of the shaft and consequently of the motor 2.

The shaft 1 of the motor 2 is also coupled to a rotary or angular encoder 3 which, in the presently-described embodiment, is adapted to provide in particular a clock signal formed for example by five hundred and twelve pulses per revolution of the shaft 1. This encoder 3 comprises a disc 4 on the periphery of which are provided in particular, for example, five hundred and twelve perforations 5 which are equally spaced apart and capable of allowing the passage of light issuing from a lamp 6 placed on one side of the disc, this light being adapted to act on a photo-electric cell 7 placed on the other side of the disc 4. The pulses from the cell 7 are sent to a clock shaper circuit 8. The latter provides at its output a train of five hundred and twelve pulses per revolution of the shaft 1. The shaper circuit 8 is also connected to a frequency doubler 9 which furnishes at its output a train of one thousand and twenty four pulses per revolution.

Figure 2B:
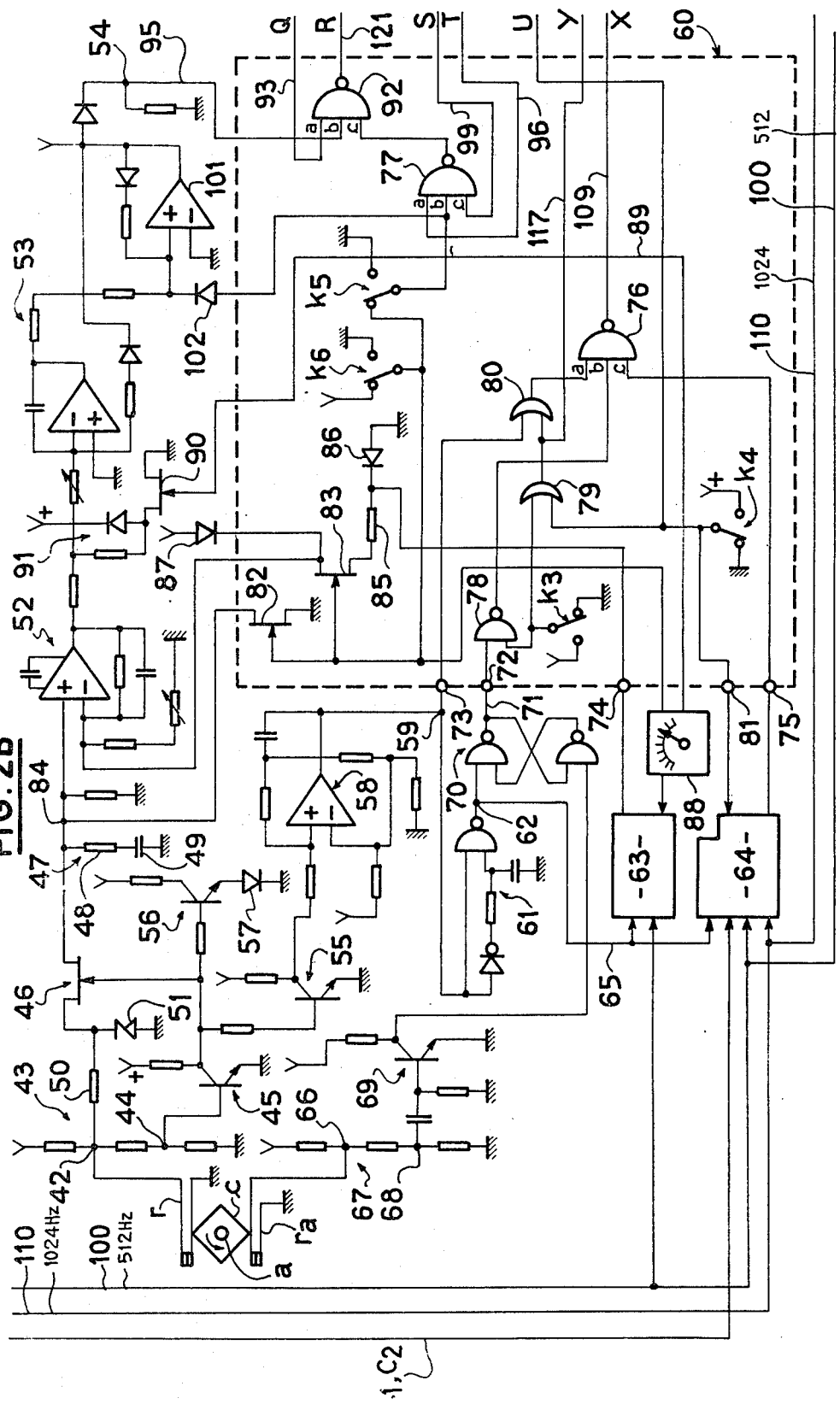
Figure 2C:
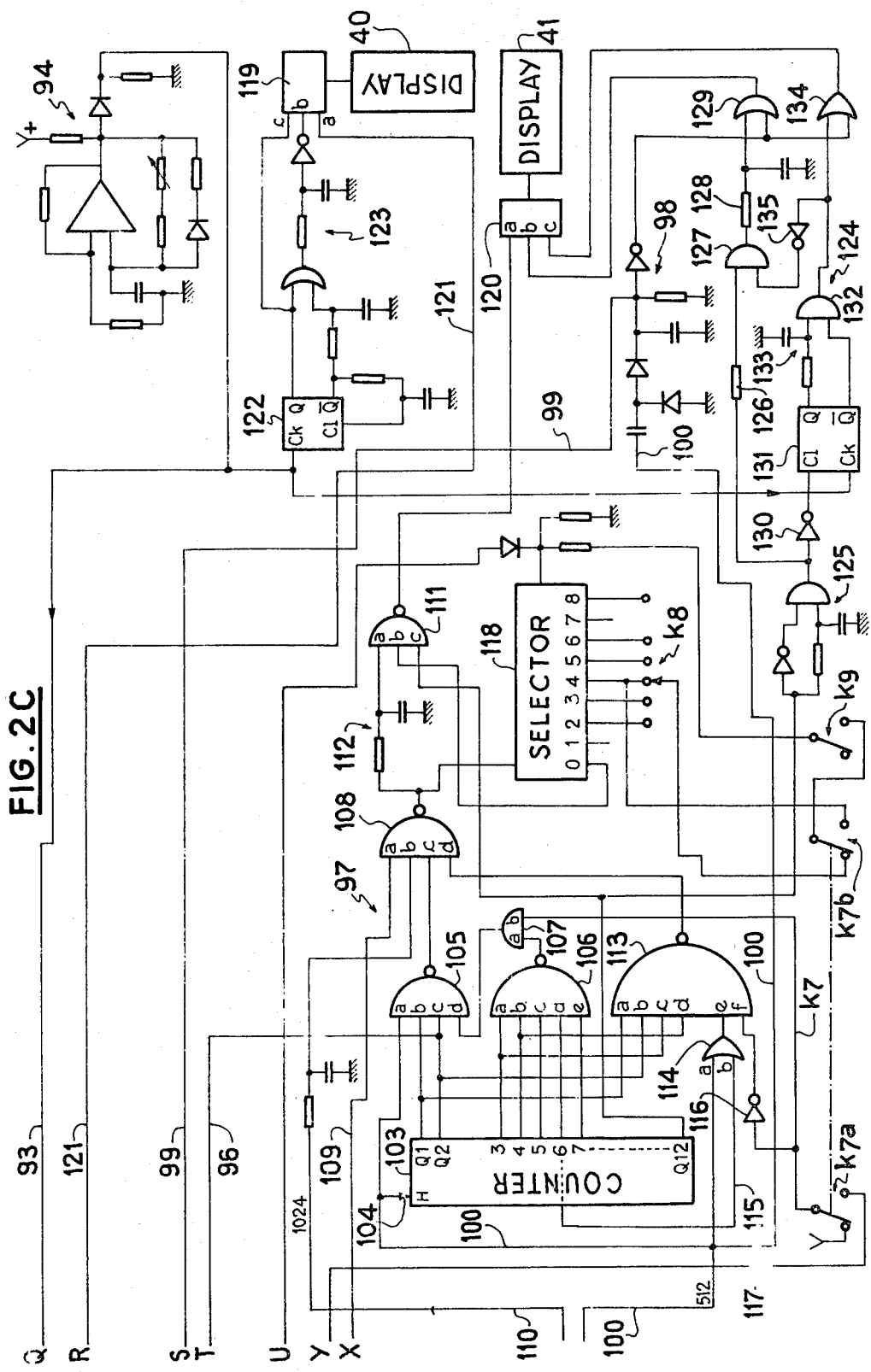

The contact breakers r and $r_a$ are connected to an electronic circuit designated by the reference 10 in FIG. 1 the detailed diagram of which is shown in FIGS. 2A to 2C. This circuit 10 is also connected to the shaper circuit 8 and the frequency doubler 9.

With reference to FIGS. 2A to 2C, a detailed description will now be given of the whole of the electronic circuit 10, in starting with the description of the circuit controlling the motor 2 the diagram of which is shown in FIG. 2A and is designated by the reference 11. The output signal of the shaper circuit 8 is first applied to a monostable circuit 12 which converts the train of pulses produced by the encoder 3 (the pulse width of which varies with the speed of the shaft 1) into a train of pulses the pulses of which have a constant duration irrespective of the speed of rotation of the shaft 1 and disc 4.

The output of the monostable circuit 12 is connected to a converter-integrator 13 in which a sampling is effected (FET), which ensures that the output voltage at the terminal 14 is devoid of any alternating component which would be liable to disturb the operation of the circuits which follow on this converter. The converter-integrator 13 is connected to a follower amplifier 15 the output 16 of which is applied to a comparator 17 which generates at a terminal 18 a control signal adapted to control the speed of the motor 2.

The comparator 17 is connected through its terminal 19 to a circuit 20 which furnishes a reference voltage or a set speed signal. This circuit 20 comprises in particular a potentiometer 21 for regulating the speed and a switch 22 for suddenly increasing the set speed signal for rapidly accelerating the motor 2 and thereby simulating the accelerations which may occur in the internal combustion engine and to which the ignition distributor under test may be subjected in normal operation. The output 23 of the reference circuit 20 is connected to the terminal 19 of the comparator 17 through an inverter 24.

The output terminal 18 of the comparator 17 is connected to the input of an impedance matching circuit 25 which transmits the control signal to a power stage 26 applied to a magnetic amplifier 27 of conventional type supplying power to the motor 2. The direction of rotation of this motor may be selected by means of two bipole switches K1 and K2 connected to the armature I of the motor 2 in accordance with a known circuit. The control circuit 11 also comprises a safety circuit 29 which blocks the signal controlling the speed of the motor 2 appearing at the terminal 18 by a signal produced in a line 30 which constitutes the output thereof. The safety circuit performs two functions.

A first of these functions consists in supervising the operation of the lamp 6 of the coder 3. As can be seen, the lamp 6 is connected in a series circuit comprising a transistor 31, the lamp 6 and a resistor 32, the junction between the lamp 6 and the resistor 32 being applied to a comparator 33 which supervises the voltage of this junction. If the lamp 6 has just been cut off, which could result in the racing of the motor 2, the input signal at the positive terminal of the comparator 33 is eliminated, which triggers the latter and causes it to transmit a blocking signal through the line 30 to the terminal 18. This signal then cancels out the control signal and blocks the transistor of the impedance matching circuit 25 so that the motor 2 stops.

The second function of the safety circuit consists in arranging that for any new starting up of the motor 2, the operator is obliged to return the potentiometer 21 to its low speed setting so that the motor 2 is unable to suddenly assume a high speed and thereby drive the ignition distributor A at this speed, which could be dangerous.

For this purpose, the safety circuit 29 comprises a source of light 34 placed near to a photodetector 35, these two components being associated with the switches K1 and K2 for supervising their position in such manner that the source 34 is illuminated when the two switches K1 and K2 are at rest (case shown in FIG. 2A). On the other hand, when one or the other of these switches K1 or K2 is put into its operative position, the source 34 is extinguished and furnishes no luminous signal to the photodetector 35. The signal coming from the photodetector 35 is transmitted through a line 36 to the positive terminal of a comparator 37 which receives at its negative terminal a voltage through a line 38 which constitutes the output of the inverter 24 which is part of the set signal circuit 20. Consequently, the signal furnished by the photodetector 35 is compared with the reference voltage at the output 24 (line 38) and if this reference voltage is higher than a certain level determined by the trigger threshold of the comparator 37, this comparator triggers a switching transistor 39 which is connected to the output of the comparator 37, its collector being connected through the line 30 to the terminal 18 constituting the input of the impedance matching circuit 25. The voltage controlling this matching circuit is then eliminated and the motor 2 cannot start up. On the other hand, if the reference voltage in line 38 is lower than the fixed threshold value, which can be achieved if desired by the operator by acting on the potentiometer 21, namely by setting it in a position corresponding to a lower speed, the transistor 39 is blocked and the signal from the comparator 17 can reach the impedance matching circuit 25 and control the motor in such manner that it only starts up at a low speed determined by the position of the potentiometer 21.

FIGS. 2B and 2C show the testing part proper of the circuit of the apparatus according to the invention.

The following operations can be carried out by this apparatus:

1. The testing of the speed of rotation of the shaft 1 and consequently of the ignition distributor A (tachometry).
2. The measurement of the contact resistance of the contact breaker r.
3. The measurement of the dissymetry of the lobes of the cam c.

These three functions are displayed by a digital display device 40 (FIG. 2C).

4. The measurement of the ignition advance angle and the evolution of this angle as a function of the speed of rotation of the motor 2.
5. The measurement of the "cam angle", that is to say the angle through which the shaft a of the distributor A must rotate so that the points of the contact breaker r close and again open.
6. The measurement of the synchronization of the operation of the contact breakers r and $r_a$, these two contact breakers being angularly spaced apart for example 180° as shown in FIG. 1, which may be the case in ignition distributors for internal combustion engines the ignition circuit of which is double (engines having for example eight cylinders).

The latter three operations are displayed on a digital display device 41 (FIG. 2C).

The contact breaker (FIG. 2B) is grounded and also connected to a junction point 42 of a voltage divider 43 connected between the supply voltage and ground.

Note that the whole of the circuit is supplied with direct current of various voltages by a supply circuit (not shown) known per se.

The voltage divider 43 comprises another junction point 44 which is connected to the base of a transistor 45 the collector of which is connected to the control electrode of a FET 46 constituting a sampling component. The voltage of the junction point 42 is proportional to the contact resistance between the two points of the contact breaker r and, when the FET 46 is rendered conductive, the value of this voltage is transmitted to a memory circuit 47 comprising a resistor 48 and a capacitor 49 which is grounded. On the other hand, when the contact breaker r is open, the transistor 45 is conductive and thereby blocks the transistor 46, the voltage previously stored in the capacitor 49 being then employed for measuring the contact resistance of the contact breaker r. The junction point 42 is connected to the transistor 46 through a resistor 50, the junction between the latter and the transistor 46 being grounded through a Zener diode 51 which protects the transistor 46 against overvoltages, the voltages lower than its threshold value being transmitted with fidelity whereas the higher voltages are blocked.

The voltage furnished by the memory circuit 47 is transmitted to an operational amplifier 52 which, as explained hereinafter, performs a selecting function and is capable, when it is enabled for this purpose, of transmitting the voltage representing the contact resistance to an analog-digital converter 53 formed by a relaxation circuit and converting the analog information of its input into a train of pulses the frequency of which is proportional to this input signal, the measurement signal being produced at the output terminal 54.

With further reference to FIG. 2B, it can be seen that the collector of the transistor 45 is connected also to an inverting transistor 55 which follows the conductive state or blocking state of the transistor 45 and at the collector of which therefore appears a series of pulses the pulses of which are produced at the rhythm of the closure of the contact breaker r. The collector of the transistor 45 is also connected to another transistor 56 in the emitter line of which is connected an electroluminescent diode 57 which consequently lights up at the rhythm of closure of the contact breaker r. This diode is adapted to signal to the operator that the contact breaker r is closed and that he can consequently read off the contact resistance thereof from the display device 40 when the motor 2 is stationary.

The signal from the collector of the transistor 55 is applied to a filter circuit 58 which is adapted to eliminate from the useful signal the parasites due to the rebounds of the points of the contact breaker r. This filter therefore precludes the passage of comparatively excessively short pulses into the following circuits of the circuitry. The output 59 of the filter circuit 58 is applied to a selecting circuit 60, which will be described hereinafter, and also to a monostable shaper circuit 61 the output 62 of which is connected to a circuit 63 for measuring the dissymmetry of the cam c and moreover to a circuit 64 generating an ignition advance signal, their input signal being transmitted through a conductor 65. These circuits 63 and 64 will be described in detail hereinafter.

The contact breaker $r_a$ is on one hand grounded and on the other connected to a junction point 66 of a voltage divider 67 another junction point 68 of which is connected to a transistor 69 at the collector of which appears a train of pulses the pulses of which represent the instants of closure of this contact breaker $r_a$. The collector of the transistor 69 is connected to a flip-flop circuit 70 the other input of which is connected to the output of the monostable circuit 61. The flip-flop 70 is adapted to generate at its output 71 the signal representing the degree of synchronization between the contact breakers r and $r_a$. This signal is applied also to the selecting circuit 60, namely to a terminal 72.

The signal appearing at the terminal 59 also constitutes a measurement, in the form of a pulse length, of the time during which the constant breaker r is closed upon the passage of each lobe of the cam c. This signal is also applied to the selecting circuit 60 through an input terminal 73.

The outputs of the circuits 63 and 64 respectively adapted to furnish a cam dissymmetry signal and a signal controlling the ignition advance are also connected to the selecting circuit 60, namely through the input terminals 74 and 75.

The selecting circuit 60 (FIG. 2B) comprises two sets of push-button switches K3, K4 and K5 respectively, mecanically coupled in pairs In other words, when the switch K3 is depressed, it is locked into this position, the switch K4 being then in the non-depressed or outer position. Inversely, if the switch K4 is depressed, the switch K3 is in its outer position. Moreover, when the two switches K3 and K4 are not depressed, a third selecting function is ensured.

The switches K5 and K6 are coupled together in the same way so that the following table may be drawn up.

TABLE

| Switches | | | | Measurement | | Measurement signal |
|---|---|---|---|---|---|---|
| K3 | K4 | K5 | K6 | Display device 40 | Display device 41 | delivered : |
| pushed in | out | — | — | — | Synchro $r_a$, $r_b$ | at terminal 72 |
| out | pushed in | — | — | — | Ignition advance | at terminal 75 |
| out | out | — | — | — | Cam angle | at terminal 73 |
| — | — | pushed in | out | Cam symmetry | — | at terminal 74 (analog) at terminal 95 (digital) |
| — | — | out | pushed in | Contact resistance | — | memory 47 (analog) at terminal 95 (digital) |
| — | — | out | out | Tachometry | | in line 96 |

Note that the display devices 40 and 41 can operate simultaneously since two measurements selected respectively from the two groups of measurements may be effected at the same time.

The selecting circuit 60 comprises two selecting gates 76 and 77 respectively in the form of NAND gates which have three inputs and are associated with the switches K3, K4 and K5, K6. The switches K3 to K6 are in the form of inverters. The moving contact of the switch K3 is connected to an input of a NAND gate 78 and moreover to an input of a NOR gate 79. The fixed contacts are respectively connected to a positive supply voltage and to the ground.

The other input of the NAND gate 78 is connected to the terminal 72 and to the output of the synchronization measuring flip-flop 70, whereas its output is connected to the input b of the gate 76. The output of the gate 79 is connected to the input of another NOR gate 80 the second input of which is connected to the terminal 73 (terminal 59) at which appears the "cam angle" signal.

The output of the gate 80 is connected to the input a of the NAND gate 76.

The switch K4 is connected through its fixed contacts respectively to the supply voltage and to the ground, whereas its moving contact is connected to the second input of the gate 79 and moreover to an enabling input 81 of the measuring circuit 64 measuring the ignition advance, the signal appearing at this terminal resulting in the production of a measurement signal at the terminal 75.

When the switch K3 is depressed, the gate 78 is unblocked so that the synchronization measurement signal (manifested by a varying pulse length) is applied to the input b of the gate 76 which opens during the interval of time corresponding to the presence of this signal. The output of the gate 76 is then sent to the following circuits of the circuitry. The input a of the gate 76 is inhibited by the gate 80 and the input c of the gate 76 is inhibited by the switch K4.

When the switch K4 is depressed, the switch K3 cannot be depressed. It then sends an enabling signal to the terminal 81 and the "ignition advance" measurement signal passes through the input c of the gate 76 which transmits it to its output, the other two inputs of the gate being inhibited by the gates 79-80.

If none of the switches is actuated, the gate 80 allows through the "cam angle" signal from the input terminal 73 to the input a while the inputs b and c are inhibited by the switches K3 and K4 and the gates 78 and 79.

The moving contact of the switch K6 is connected to the control electrodes of two FETs 82 and 83 and moreover to one of the fixed contacts of the switch K5. These fixed contacts are respectively connected to the supply voltage and to the ground.

The fixed contact of the switch K5 opposed to that connected to the switck K6 is connected to the ground and its moving contact is connected to the input b of the NAND gate 77. The source and the drain of the transistor 82 are respectively connected to the ground and to the junction 84 between the memory 47 and the positive input of the operational amplifier 52.

The source of the transistor 83 is connected through a resistor 85 and a diode 86 to the ground and moreover to the terminal 74 furnishing the "cam symmetry" signal from the measuring circuit 63. The drain of the transistor 83 is connected to the supply voltage through a diode 87 and to the negative input of the operational amplifier 52.

The control electrodes of the transistors 82 and 83 are moreover connected to a circuit 88 selecting the number of cam lobes whereby it is possible to adapt the circuit to the number of lobes of the cam being tested (number of cylinders of the engine for which the distributor is intended).

This circuit also sends a signal through a line 89 to a third FET 90 which permits putting into circuit a scale adapting circuit 91 for adjusting the measuring scale of the display device 40 in accordance with the number of lobes of the cam being tested.

The selecting NAND gate 77 is associated with a NAND Gate 92 which determines the duration of the measurement. The input c of the gate 92 is connected to the output of the gate 77. Its input a is connected through a line 93 to a measurement duration generator 94 (FIG. 2C) which forms an oscillator delivering a periodic enabling signal the active pulses of which have a given duration, for example 1 second, in order to limit the display of a certain value to this duration. Consequently, if this value varies from one second to another, the number displayed will vary from one interval to another.

The input b of the gate 92 receives a measurement value to be displayed from the terminal 54 of the voltage/frequency generator 53 through a line 95.

The input a of the NAND gate 77 is connected to a line 96 which transmits a tachometric signal generated in a scale converting circuit 97 (FIG. 2C) which will be described in detail hereinafter. The input c of this gate is connected to a tachometric threshold determining circuit 98 through a line 99. This circuit 98 is also connected to a line 100 which transmits thereto the clock signal having five hundred and twelve pulses per revolution coming from the shaper circuit 8 (FIGS. 1 and 2A). Consequently, it only delivers an enabling signal for the gate 77 if the number of revolutions of the shat a of the motor M exceeds a certain value, which is for example 100 rpm, this threshold being determined by the values of the components of this determination circuit 98.

The input b of the gate 77 is also connected to the operational amplifier 101 of the frequency/voltage conversion circuit 53 through a diode 102.

The signal appearing at the output of the NAND gate 92 is applied, as a signal to be displayed, to the digital display device 40 which may display, as a function of the position of the switches K5 and K6, any one of the three measurement values listed in the aforementioned table and associated with these switches.

Thus, when the switches K5 and K6 are both in their outer or non-depressed positions (illustrated positions), the NAND gates 77 and 92 define a logic condition which allows through the tachometric pulses appearing on the line 96. Under these conditions, the diode 102 receives the supply voltage through the switches K6 and K5 and thus blocks the amplifier 101 which prevents the passage of the "cam symmetry" and "contact resistance" signals to the line 95.

When the switch K5 is depressed, the gate 77 is blocked by the ground at its input b. The "tachometric" signal is blocked. Moreover, the operational amplifier 101 is unblocked. Lastly, as the transistor 83 remains conductive owing to the position of the switch K6, the "cam symmetry" signal now passes through the circuits 52 and 53 and through the NAND gate 92 to the display device 40.

When the switch K6 is depressed, the NAND gate 77 remains blocked by the ground applied to its input b, the switch K5 being normally in its outer position by construction. The transistors 82 and 83 are then blocked and the "contact resistance" signal can pass through the circuits 52 and 53 and is applied to the display device 40 through the gate 92.

The logic signals generated by the various positions of the switches K5 and K6 also control the circuit selecting the number of lobes 88 which controls the transistor 90 for a suitable adaptation of the scale of the display device 40.

The display device 41 is adapted to display either numerical values in degrees or numerical values in percentages of the measurement data which are selected by the switches K3 and K4 ("cam angle", "synchronization" and "ignition advance"), each of these data being expressed by a variable pulse length at the output of the gate 76 (FIG. 2B).

For this purpose, the output signal of this gate 76 is processed in the scale converting or transcoding circuit 97 which will now be described.

This circuit comprises a counter 103 having a control input H, 104, which is connected to the line 100 transmitting the clock signal having five hundred and twelve pulses per revolution. The counter has twelve outputs numbered from Q1 to Q12. The outputs Q8 to Q11 are not used.

The input 104 and the outputs 1 and 2 of the counter 103 are connected to the respective inputs a to c of a NAND gate 105. The outputs 3 to 7 of the counter 103 are connected to the respective inputs a to e of a NAND gate 106. The output of the gate 106 is connected to an input a of a NAND gate 107 whose output is connected to the input d of the gate 105. The output of the gate 105 is connected to the input c of a subtraction gate 108.

As described hereinbefore, the NAND gate 76 provides a pulse per revolution of the shaft 1 having a length corresponding to a certain angular value which itself translates one of the three parameters of the contact breaker being tested, chosen by means of the switches K3 and K4 as described hereinbefore. The display of this angular value on the display device 41 is achieved by applying thereto throughout the duration of said pulse a certain number of clock pulses which cause the displayed value to progress numerically and which are initially generated by the frequency doubler 9 which produces one thousand and twenty four pulses per revolution. In order to facilitate the reading of the measurement value, it is preferable that the latter be displayed in degrees of angle on the basis of 360° per revolution of the shaft 1.

The measurement pulse from the gate 76 is applied through a line 109 to the input a of the NAND gate 108 which is therefore open only during the presence of this measurement pulse. This gate also receives the clock signal of one thousand and twenty four pulses per revolution through a line 110 which is connected to the input b of this gate. In order to express the value to be displayed (number of pulses appearing during the measurement pulse) as a value of angle based on a scale of 360°, the clock signal must be converted in such manner that the NAND gate 108 produces per revolution of the shaft 1, a pulse train which is compatible with a full scale of 360°.

This conversion of the measured value into a value capable of being displayed in units of degrees is achieved in subtracting in each revolution one hundred and twenty four pulses from the clock signal of one thousand and twenty four pulses, which gives for each revolution only nine hundred clock pulses. By effecting this conversion during four revolutions and by mixing this new clock signal, by a logic operation, with the measurement pulse, the display device will see during the measurement pulse a certain number of pulses the calculation basis of which is 4×900=3,600. It is then sufficient to place in the display device a point between the last two figures displayed to obtain a direct read-out in degrees of angle. In other words, the gate 108 must effect the subtraction operation 1,024−124 to obtain, for one revolution of the shaft 1, a signal of nine hundred pulses on which the display read-out may be based.

Bearing in mind that the NAND gate 105 receives the clock signal having five hundred and twelve pulses and two other output signals Q1 and Q2 of the counter, (neglecting the input d of this gate), it furnishes at its output one pulse every four pulses of the clock signal of five hundred and twelve pulses, in other words, one hundred and twenty eight pulses per revolution of the shaft 1. However, the input d of this gate 105 is connected through the NAND gate 107, which has a switching function, to the output of the NAND gate 106 which is connected to the counter 103 in such manner as to furnish per revolution of the shaft 1, one pulse every one hundred and twenty eight pulses, that is to say four pulses per revolution. Each of these four pulses is capable of inhibiting the gate 105 so that the latter delivers at its output only 128−4=124 pulses per revolution of the shaft 1. This output is therefore capable of inhibiting the gate 108 one hundred and twenty four times per revolution of the shaft 1 so that everything occurs as though it transmitted clock pulses only at the rhythm of nine hundred pulses per revolution, which constitutes the required conversion. As will be seen hereinafter, the display is produced only every four revolutions of the shaft 1.

Apart from the display in angular degree units, the circuit also permits a display in percentages relative to a complete revolution of the shaft 1, one revolution of the shaft then corresponding to a total number of 1 000, the percentage being a fraction of this number (for example 10.0% of 100.0%).

The components for performing this function are the following:

A NAND gate 113 having six inputs a to f is connected by these inputs a to d to the outputs 1 to 4 of the counter 103. The input e is connected to the input of an OR gate 114 whose input a is connected to the line 100 transmitting the clock signal having five hundred and twelve pulses per revolution. Its input b is connected to the output 6 of the counter 103 through a line 116. The output of the NAND gate 113 is connected to the input d of the NAND gate 108. Moreover, the input f of this gate is connected to a selecting circuit which will be described hereinafter and which enables the operator to choose a read-out in angular degrees or percentages.

As for the conversion into angular units, the conversion into percentages comprises subtracting, for each revolution of the shaft 1, a certain number of pulses of the pulse train passing through the NAND gate 108. In order to obtain, per revolution, one thousand units, there must be subtracted from the thousand and twenty-four possible openings of this gate 108 twenty-four evenly spaced pulses in the course of the concerned revolution of the shaft 1.

Ignoring its input e, the NAND gate is opened for delivering an inhibition signal to the input d of the gate 108, once in every sixteen pulses, namely thirty-two times per revolution of the shaft 1.

The OR gate 114 receives the signal having five hundred and twelve clock pulses and the signal of the output Q6 of the counter 103. The output of this gate 114 is therefore validated, either when the signal having five hundred and twelve pulses (line 100) is at the logic level 1, or when the output Q6 of the counter 103 is at the logic level 1. This means that the output of this gate 114 is validated three pulses in four of the signal having five hundred and twelve pulses and therefore of the signal having one thousand and twenty four pulses.

Among the thirty two pulses that the gate 114 must supply to the input e, three quarters thereof, namely twenty-four pulses per revolution of the shaft 1, are therefore finally transmitted.

The selecting circuit whereby the operator may choose a read-out in degrees or percentages comprises a bipolar reversing switch the first section K7-a of which comprises a moving contact which is connected to an inverter 116 whose output is connected to the input f of the gate 113 and moreover to an input of the gate 107. One of the fixed contacts is connected to a source of supply voltage whereas the other fixed contact is connected through a line 117 to an input of the OR gate 80 (FIG. 2B). When the moving contact K7-a is placed on the fixed contact connected to the supply voltage, the NAND gate 113 is inhibited and the read-out is in degrees. In the opposite case, the gate 107 is inhibited and this prevents the operation of the gate 105 and the read-out is in percentages.

Note that the line 117 enables an enabling signal coming from the gate 79 to be transmitted which inhibits the gate 113, and therefore the read-out in percentages, in the case where the witches K3 and K4 are placed in the positions corresponding to the "ignition advance" and "synchro" selections. The reason for this is that it is usual to measure these values only in degrees.

In the case where the measurement consists in obtaining the "cam angle" parameter, the configuration of the cam of the contact breaker must be taken into account, since the cam will differ in accordance with the number of cylinders of the internal combustion engine for which the tested ignition distributor is intended. In this case, the result of the measurement is divided by a frequency divider 118 the outputs of which are respectively connected to a selector K8 the slider of which may be placed selectively on these outputs. The frequency divider 118 is only rendered operative when a switch K9 coupled to the switches K3 and K4 is placed in a position corresponding to the measurement of the "cam angle".

In the illustrated embodiment, the display devices 40 and 41 comprise display tubes or electroluminescent diodes and their associated circuits known per se. Each display device is connected to a display memory 119 and 120 respectively, comprising a signal input a, an input b for resetting to zero and a transfer control input c which, when excited, enables the contents of the memory 119 or 120 to pass into the associated display device 40 or 41.

The input a of the display memory 119 is connected through a line 121 to the output of the NAND gate 92 from which it receives the measurement pulse train relating to the measuring mode in use (tachometry, contact resistance and cam symmetry).

The input b of the memory 119 is connected to the output Q of a D-type latch 122 whose input Ck is connected to the duration generator 94. The output Q of the latch is connected through a logic delay circuit 123 to the input c of the memory 119. This circuitry resets the memory 119 to zero and transfers its content to the display device 40 at instants determined by the control pulses of the generator 94.

The input a of the memory 120 is connected to the output of the gate 111 which transmits the pulse result of the measurements "cam angle", "ignition advance" and "synchro" to this memory. In order to permit a read-out in degrees, that is to say every four revolutions of the shaft 1, the resetting and the transfer of the memory 120 are controlled in accordance with the signal appearing at the output 12 of the counter 103, through a display control circuit 124.

The output 12 of the counter 103 is connected to a monostable circuit 125 of this display control circuit 124 the output of which is connected through a resistor 126, an AND gate 127 and an RC circuit 128 to an OR gate 129 controlling the resetting, the output of the latter gate being connected to the input b of the memory 120. The output of the delay circuit 125 is also connected through an inverter 130 to the input C1 of D-type latch 131 the outputs Q and $\bar{Q}$ of which are connected to an AND gate 132, it being understood that the output Q undergoes a delay through an RC network 133. The output of the AND gate 132 is connected to an OR gate 134 whose output is connected to the transfer input c of the memory 120.

One of the inputs of the OR gate 134 is connected moreover through an inverter 135 to an input of the AND gate 127, whereas its other input is connected to an input of the OR gate 129.

The input Ck of the D-type latch 131 is connected through a line 136 to the output of the duration generator 94.

Upon each transition of the signal from the output 12 of the counter 103, the delay circuit 125 generates a pulse of a predetermined duration (1 ms, for example) which controls the resetting of the memory 120 through the OR gate 129.

Upon the same transition, the D-type latch 131 is triggered on condition that it had previously been excited at its input Ck by the signal from the duration generator 94. In the opposite case, the display cannot occur.

The triggering of the latch 131 produces through the RC circuit 103 and the AND gate 132, a pulse signal which is applied to the transfer input c of the memory 120 through the gate 134.

The resetting and transfer pulses are initiated in synchronism but the transfer pulse inhibits the gate 129, that is to say the transmission of the resetting signal. This signal will therefore only be transmitted after the end of the transfer pulse, the duration of the resetting pulse being longer than that of the transfer pulse; in this way a reliable operation of the memory 120 is ensured.

Reference will now be made to FIGS. 3 and 4 which relate to a circuit 63 for measuring the dissymetry of the cam c, that is to say defects in the angular symmetry which may exist between the high parts or lobes of this cam.

FIG. 3 shows a counter 201 having a counting capacity which is previously determined, namely 256, and connected in such manner that when its final count has been reached, it resumes the counting from zero with no other outside intervention.

The counter 201 comprises a clock input 202 and an input 203 for resetting to zero and a series of binary outputs 204a to 204h at which the number counted in pure binary code appears.

The clock input 202 is connected to the output of the selecting circuit 88 (FIG. 2B) which permits in fact converting the clock frequency applied thereto by the lines 100 and 110 so as to permit a variation of this clock frequency. For measuring the cam dissymetry this possibility of variation is employed to adapt the circuit 63 to a given contact breaker cam, depending on whether the latter controls the ignition of an internal combustion engine of 1, 3, 4, 5, 6 or 8 cylinders. As will be understood hereinafter, the converting circuit 88 is capable of varying the fixed time reference which is created by the time required for filling the counter 201, this time of course varying in accordance with the clock frequency appearing at the input 202 of this counter 201. The circuit 63 receives the signal from the contact breaker r through the line 65 (FIGS. 2B and 3).

There is obtained in this way a first pulse train T1 (curves BB, EE and II of FIG. 4) which represents on a time basis the signal from the contact breaker r after the shaping and synchronization. The pulses T1 are delayed in a delay circuit 211 the output of which is connected to the resetting input 203 of the counter 201. The train of delayed pulses is represented by the curves CC, FF and KK in FIG. 4. The time interval between the leading edges of the pulses T1 and T2 is preferably chosen to be equal to the length of the igniting signal appearing on the line 65.

The outputs 204a to 204h of the counter 201 are connected, respectively four by four, to two memory circuits 214 and 215 each comprising a group of four direct outputs 214a and 215a and a group of four complementary outputs 214b and 215b respectively. All of the outputs of the two memories are connected to a digital-analog converter 216 which is also capable of detecting if the difference between two successive pulses is positive or negative relative to the reference interval determined by the filling time of the counter 1.

The digital-analog converter comprises a network of resistors 217 arranged in four groups 218 to 221. The resistors of group 218 are connected respectively between the outputs 214a of the memory 214 and a junction point 222 which is connected to the negative input of an operational amplifier 223 shunted by a resistor 224.

The junction point 222 is also connected to the third group of resistors 220 the resistors of which are respectively connected to three outputs 215a of the memory 215. The fourth output of this group of outputs 215a of the memory 215 is directly connected to the positive input of the amplifier 223, through a line 225.

The resistors of the group 219 are connected between the outputs 214b of the memory 214 and a junction point 226 which is connected to the negative input of an operational amplifier 227 shunted by a resistor 228. The resistors 221 connected to the three outputs of the group 215b are also connected to the junction point 226, whereas the last output of this group is directly connected to the positive input of the amplifier 227 through a line 229. The lines 225 and 229 each transmit an enabling signal to the amplifiers 223 and 227, respectively according as the most significant bit of the number stored in the memories 214 and 215 is a "one" or a "zero".

The memories 214 and 215 are controlled at their respective inputs 230 and 231 by the signal T1; in other words, each time a pulse of the signal T1 appears, the instantaneous content of the counter 201 is transferred to the memories 214 and 215.

The digital-analog converter 216 comprises also an adder circuit 232. The latter comprises a first operational amplifier 233 the positive input of which is connected to the output of the amplifier 223 and the negative input of which is connected to a grounded capacitor 234 and also to a junction point of two resistors 235 and 236 connected in series. The resistor 235 is connected to the output of the amplifier 233 through a diode 237, whereas the resistor 236 is connected to ground. The circuit just described constitutes a peak detector of the signal furnished by the amplifier 223 and its associated components.

The output of the amplifier 227 is treated in a similar way. An operational amplifier 238 is connected by its positive input to the output of the amplifier 227, its negative input being connected to ground through a capacitor 239. The output of this amplifier 238 is connected to a diode 239a which is connected to two series-connected resistors 240 and 241, which are moreover grounded. Their point of junction is connected to the negative input of the amplifier 238.

The points of junction of the resistors 235 and 236 and of the resistors 240 and 241 are connected respectively through resistors 242 and 243 to an adding point 244 which constitutes the output of the circuit and is connected to the terminal 74 (see FIG. 2B).

The measuring circuit 63 operates in the following manner (FIG. 4):

In order to test the quality of a contact breaker cam, it is useful to know the state of its high parts or lobes. In the ideal case, these lobes are arranged uniformly about the axis of the cam, the latter being of course driven in rotation in the course of the test so as to simulate its conditions of operation with an internal combustion engine. As the contact breaker r is actuated upon the passage of each lobe of the cam, the ideal case corresponds to an equal time interval between the four voltage pulses which may be measured at the terminals of the contact breaker r. For a given type of cam this ideal interval is chosen in the circuit of FIG. 3 as a reference to obtain a measurement of the quality of any cam of the same type (that is to say intended for the same number of cylinders of an engine). The ideal or reference interval (FIG. 4) corresponds to the time the counter 201 takes to be filled for a given frequency of the clock signal. The curve GG of FIG. 4 represents the clock signal applied to the counter 201.

The curves AA, BB and CC of FIG. 4 show that the igniting or firing signal produces on its leading edge a pulse T1 and on its trailing edge a pulse T2.

The pulse T1 controls the storage of the content of the counter 201 in the memories 214 and 215, whereas the pulse T2 controls the resetting of the counter.

At time $t_0$, on the leading edge of the firing pulse, the preceding content of the counter 201 is stored and at time $t_1$, on the trailing edge of the firing pulse, the counter is reset and starts to be filled.

According to the curves AA, BB and CC, it is assumed first of all that the cam c being tested is exactly symmetrical and that the pulses it produces at the contact breaker r are therefore equally spaced apart in time. Consequently, when at time $t_3$ the trailing edge of the firing pulse produces the following pulse T2, the content of the counter 201 is exactly zero and the resetting by the pulse T2 has consequently no effect. Previously, the pulse T1 caused the storing of the counter 201, which, in the case shown in FIG. 4, would have introduced into the memories 214 and 215 the number 1111.1110. This would consequently correspond to an inaccuracy of the circuit, since in fact it was assumed that the successive firing pulses are exactly spaced apart by the reference interval so that the content of the memories should be 0000.0000. But, it must be noted that for reasons of explanation, FIG. 4 does not exactly correspond to reality, since the clock period should be distinctly greater than the duration of the firing pulse and the interval which separates each time the pulses T1 and T2. In the case of a perfect symmetry of the cam c, the number stored will therefore be 0000.0000 in the real circuit.

When a lobe of the cam c is angularly offset relative to perfect symmetry, the firing signal can occur before or after the complete lapse of time corresponding to the reference interval, or, in other words, before or after the complete filling of the counter 201. Examples of these cases are represented in FIG. 4 by the curves HH, II, KK and DD, EE, FF respectively.

In the case of curves DD, EE, FF, the number recorded in the counter 201 is 0000 0110 when a firing pulse arrives (instant $t''_2$) which is therefore lagging with respect to the reference interval. This number is also stored in the memories 214 and 215, but owing to the fact that the output of the memory corresponding to the conductor 229 is a "one" (that is to say the complement of the most significant bit in the considered case), the amplifier 227 is saturated and therefore cannot transmit the corresponding signal. The line 225 transmitting a signal of level "zero", the signal received by the amplifier 223 through the resistors 218 and 220 is transmitted to the peak detector 233 and is thus capable of being stored in the capacitor 234 if the signal of this conductor does not have a higher value, that is to say if no greater dissymetry in the same direction in the cam has occurred previously (for example in respect of a preceding lobe of the cam). When the counter 201 receives the pulse T2 (instant $t'_3$) it is reset and the measuring process recommences for the following lobe of the cam.

On the other hand, in the case of the curves HH, II and KK, the leading edge of the firing pulse coincides with the instant $t'_2$, at which the counter 201 has recorded a number 1111.1001. This number is stored upon the appearance of the pulse T1. This number is found at the output of the memories 214 and 215.

As the line 225 is at level "1", the amplifier 223 is saturated and transmits no signal and it is the complement of the number which will be transmitted through the resistors 219 and 221 and the amplifier 227. The corresponding signal will possibly be stored in the capacitor 239, if the signal of this capacitor does not have a higher value.

Thus there is obtained in a complete measuring cycle of a cam which undergoes a great number of revolutions, at the point 244, the sum of the positive and negative maximum errors of the opening instants of the contact breaker r.

There will now be described the circuit 64 for measuring the "ignition advance" with reference more particularly to FIGS. 5 to 8.

Figure 5:
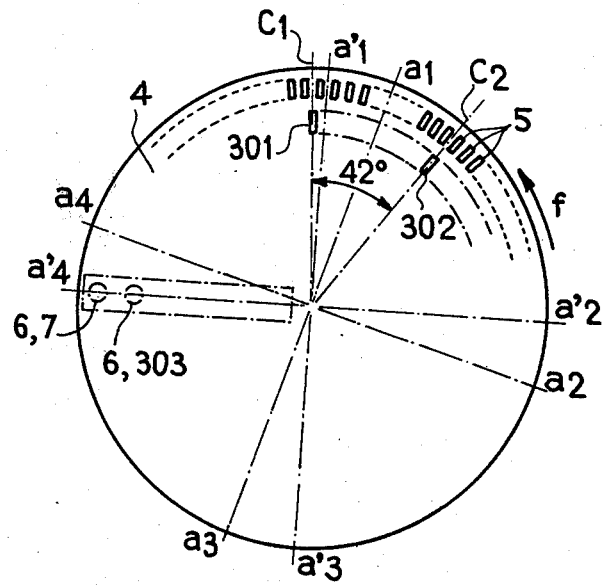
FIG. 5 represents diagrammatically the angular encoder disc of the apparatus according to the invention.

FIG. 5 shows to a larger scale than FIG. 1 the disc 4 of the angular encoder 3 comprising in particular the track of 512 perforations 5 mentioned hereinbefore and acting as a clock track. If the ignition distributor A is adapted to control, for example, a four-stroke four cylinder engine, it generates in the course of its operation four ignition initiating signals in accordance with the speed of rotation which varies angularly. The measuring circuit 64 is capable of generating as many electric initiating pulses termed here "firing pulses $a_1$ to $a_4$" which may be symbolically represented electrically by four positions on the disc 4 which move in the direction of arrow f. The positions of these firing pulses vary with the speed by an angular offsetting of the contact breaker r relative to the shaft of the distributor, in the manner well known in the automobile art, this offsetting ensuring in fact the ignition advance in an engine (pulses $a'_1$ to $a'_4$). The measuring circuit 64 permits measuring the evolution of this offset as a function of the speed of rotation of the shaft 1 and therefore of the disc 4 (FIG. 1). It will be understood that the operation of the distributor of an internal combustion engine having an electric ignition in which the pulses $a_1$ to $a_4$ and $a'_1$ to $a'_4$ are defined by the instant of closure of its contact breaker r, is in this way simulated.

Figure 6:
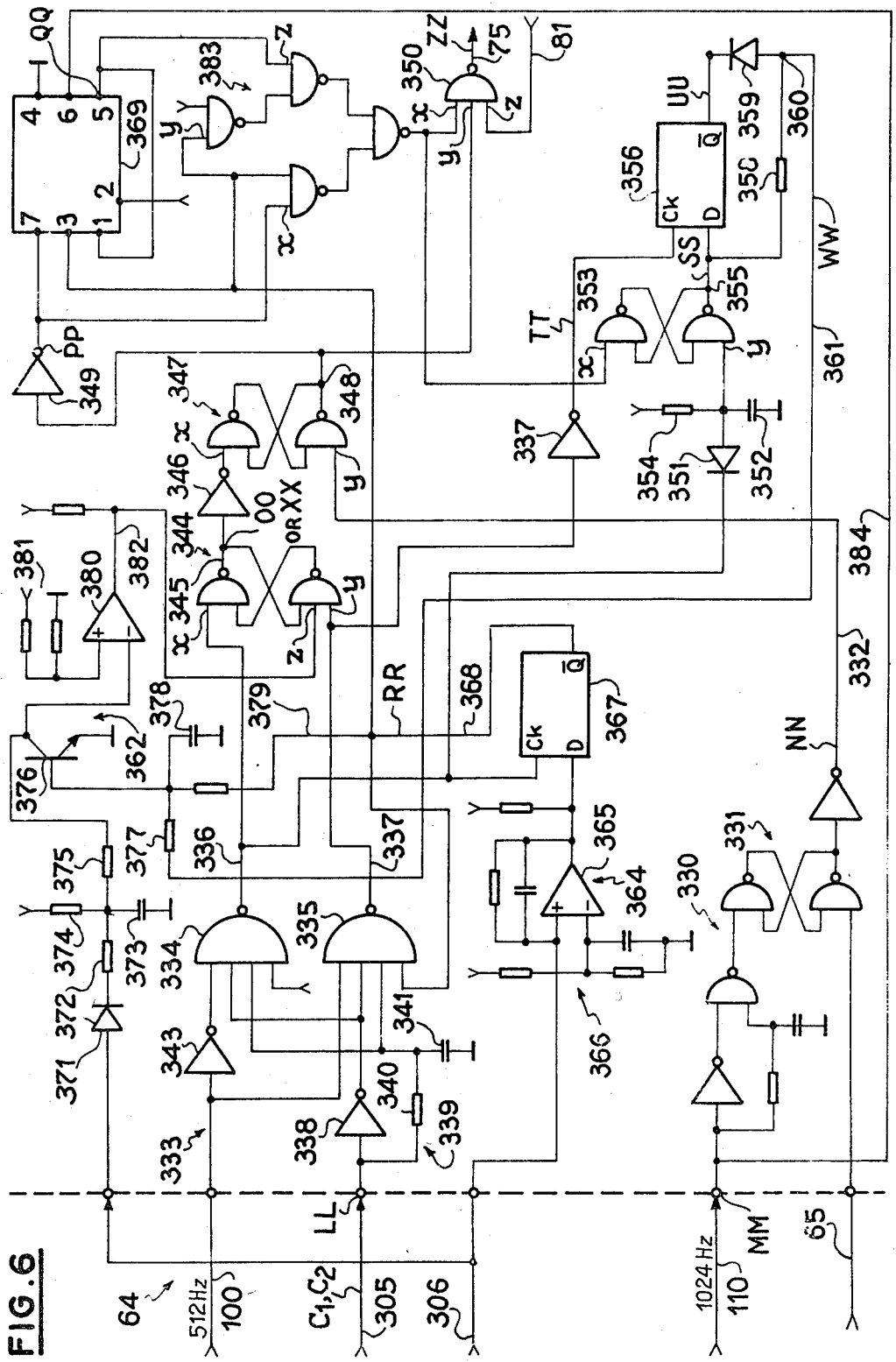
FIG. 6 represents a detailed diagram of a circuit for measuring the ignition advance employed in the circuit of FIGS. 2A, 2B and 2C, and FIGS. 7 and 8 represent the waveforms appearing at the outputs of certain circuits of the measuring circuit of FIG. 6.

With reference now more particularly to FIG. 6, it can be seen that a distributor A to be tested is mounted on the shaft 1 which is rotatable in a support (not shown) by means of a variable-speed electric motor 2.

FIG. 5 shows that the disc 4 of the angular encoder 3 comprises a second track having only two perforations 301 and 302 which are spaced 42° apart in the presently-described embodiment. The lamp 6 (FIGS. 1 and 2A) illuminates through the perforations 301 and 302 a photoelectric cell 303 which is connected to a shaper circuit 304 (FIG. 2A) which provides a "locating signal" constituted by two pulses C1 and C2 spaced electrically 42° apart and appearing in succession in the course of each revolution of the disc 4. Note that, as shown in FIG. 5, these pulses are in phase opposition relative to the clock pulses so as to render the device independent of the direction of rotation of the distributor to be tested. The shaper circuit 304 is connected to a line 305 (FIGS. 2A and 6). The measuring circuit 64 is also connected to the circuit 11 controlling the motor M (FIG. 2A) which provides an analog signal at the terminal 16 which is a function of the speed of rotation of the shaft 1, this signal being applied to the circuit 64 through the line 306.

FIG. 6 shows that the circuit 64 comprises a synchronizing circuit 330 to which are applied the clock signal coming from the doubler 9 and the firing signal transmitted in the line 65, to synchronize the firing signal with the clock by means of a bistable multivibrator 331. The output signal of the circuit 330 apppears in line 332.

A selecting circuit 333 comprising two NAND gates 334 and 335 is adapted to provide in the two respective output lines 336 and 337 the locating signals C1 and C2, each of which is synchronized with the clock signal. For this purpose, the line 305 is connected in parallel to two equivalent inputs of the gates 334 and 335 through an inverter 338 and to two other equivalent inputs through a differentiating circuit 335 comprising a resistor 340 and a capacitor 341. The shaper circuit 8 is directly connected through the line 100 to a third input of the gate 335, the equivalent input of the gate 334 being connected to this line 100 to an inverter 343.

The output lines 336 and 337 are respectively connected to the triggering inputs x and y of a flip-flop 344 comprising two NAND gates. The output 345 of this flip-flop 344 is connected to an inverter 346 which is connected to the set input x of a second flip-flop 347 which also comprises two NAND gates and whose other reset input y is connected to the line 332. The output 348 of this flip-flop is connected to an inverter 349 and to the input y of a NAND gate 350 constituting the output of the measuring circuit 64.

The line 336 is connected to a diode 351 which is grounded through a capacitor 352 and connected to an input y of a flip-flop 353 and to a polarization resistor 354 which receives a supply voltage +V.

The output 355 of the flip-flop 353 is connected to the input D of a D-type latch 356 whose clock input Ck is connected to the line 337 through an inverter 357. The output $\overline{Q}$ of the latch 356 is connected to the input D of the latter through a resistor 358 and a diode 359 connected in series. The junction point 360 of these two components is connected to a safety delay circuit 362 through a line 361.

The speed signal transmitted through line 306 is applied to a mode selecting circuit 364 which comprises an operational amplifier 365 whose positive input is connected to the line 363 and whose negative input is connected to a reference circuit 366. The output of the amplifier 365 is connected to the input D of a D-type latch 367 whose input Ck is connected to the line 336 for receiving the pulses $C_1$. The output $\overline{Q}$ of this latch 367 is connected through the line 368 to the trigger input 3 of a shift register 369 and, through a line 370, to a fourth input of the NAND gate 335 of the selecting circuit 333.

The line 306 is also connected to a diode 371 of the safety delay circuit 362. This diode 371 is connected in series with a resistor 372 which is connected by its opposite terminal to a junction between a grounded capacitor 373 and a resistor 374 (which is connected to the supply voltage $+V$) and a resistor 375. The latter constitutes the collector resistance of a transistor 376 whose base is connected through a resistor 377 to the line 361 and through a capacitor 378 to ground. The emitter of the transistor 376 is grounded. The base of the transistor 376 is also connected to the output $\overline{Q}$ of the latch 367 through a line 379.

The collector of the transistor 376 is connected to the negative input of an operational amplifier 380 whose positive input is connected to a reference circuit 381. Its output is connected through a line 382 to the input z of one of the NAND gates of the flip-flop 344.

The output of the inverter 349 is connected to the input 7 of the shift register 369 and to an input x of a selecting circuit 383 comprising four NAND gates and adapted, under the control of a signal coming from the output $\overline{Q}$ of the D-type latch 367 and applied to an input y, to select either the signal appearing as an input at the terminal 7 of the register 369, or the output of the latter appearing at the terminals 1 and 5 and applied to the input z of the selecting circuit 383.

The shift register 369 receives also the clock signal of the line 170 at its terminal 6 through a line 384. The output 1 of the selecting circuit 383 is connected to the input x of the flip-flop 353 and to the input x of the output gate 350. The input z of the latter is connected to the terminal 81 (FIG. 2B) to permit the selection of the transfer of information generated in the measuring circuit 64 to the selecting circuit 60.

The measuring circuit 64 operates in the following manner (FIGS. 7 and 8).

In the course of this operation, two cases may be met with in the course of each revolution of the shaft 1:

(1) The first pulse $a_1$ to be examined occurs between the locating pulses $C_1$ and $C_2$ (case of FIG. 5).

(2) The first pulse $a_1$ occurs after the locating pulse $C_2$.

This alternative is due to the fact that the measuring circuit 64 is so designed that the operator has no need to previously choose the angular position of the ignition distributor to be tested (relative to the shaft 1) and consequently of the disc 4. This results in considerable convenience in use.

Note that in FIGS. 7 and 8 there has been represented a cycle of signals corresponding to one revolution of the shaft 1, this cycle being consequently repeated continuously in the course of the rotation of the shaft 1, the curves representing respectively the signals appearing at the points of the diagram of FIG. 6 having the same double-letter references.

In the case where the device is specifically intended to test ignition distributors, the electric angle between the pulses $C_1$ and $C_2$ is preferably chosen to be slightly less than 45°, for example 42°. Consequently, this device is applicable to the ignition distributors of practically all internal combustion engines, including those having eight cylinders in respect of which the distributor provides a firing pulse every 45°, the device having nonetheless an angle between the locating pulses $C_1$ and $C_2$ which is as large as possible.

However, an exception must be envisaged which is formed by the case of an ignition distributor for an engine having a single cylinder which could not be controlled if its firing pulse appeared always between the pulses $C_1$ and $C_2$. For this particular case, there is consequently required a previously determined angular positioning between the shaft 1 and the distributor to ensure that the firing pulse occurs after the pulse $C_2$.

The measuring and calculating procedure of the device according to the invention occurs in two successive steps, irrespective of the case mentioned hereinbefore. The transition between these steps is determined by the mode or step selecting circuit 364 which establishes a speed threshold, set for example at 300 rpm, of the shaft 1 (idling speed of an internal combustion engine) and is connected to the control circuit 11 through the line 306. The first step consists in storing the angular position $a_1$ or $a_2$ according to either of the two cases mentioned hereinbefore. For an ignition distributor, this corresponds to storing one of the firing pulses per cycle without there being as yet an ignition advance. For this purpose, the signal of the line 306 passes through the operational amplifier 365 fixing the aforementioned threshold to bring the output $\overline{Q}$ of the D-type latch 367 to the high level. There results a signal initiating the storing for the shift register 369 in the line 368 (curve RR of FIG. 7).

The signal corresponding to the pulses $a_1$ to $a_4$ (FIG. 5) is synchronized with the clock signal of the line 110 (curve MM of FIG. 7) in the synchronizing circuit 330 and the inverted synchronized signal appears in line 332 (curve NN).

The signal representing the pulses $C_1$ and $C_2$ is processed in the gates 334 and 335 which respectively provide at their outputs 336 and 337 distinct pulses $C_1$ and $C_2$ (the signal of line 305 is represented by the curve LL of FIGS. 7 and 8) which are synchronized with the clock signal applied to the gates 334 and 335 through the line 100. The synchronized pulses $C_1$ and $C_2$ actuate the flip-flop 344 which is triggered by the pulse $C_1$ and reset to its initial state by the pulse $C_2$. At the output 345 of the flip-flop 344 therefore appears a pulse which is at the high level between the pulses $C_1$ and $C_2$ (curve OO). The output of the flip-flop 344 is capable of resetting the flip-flop 347 to its initial state after inversion in the inverter 346. The latter flip-flop may be triggered in each cycle by a firing pulse under conditions which will be explained hereinafter. Indeed, in the case 1 considered here, the output 348 of the flip-flop 347 which is brought to the low level, upon the appearance of the pulse $C_1$, by the flip-flop 344, can be re-established during the application of the firing pulse $a_1$ which is synchronized and transferred through line 332 and returns to the initial level when this pulse disappears (at the instant of the appearance of the 1024 Hz clock pulse immediately following on this firing pulse). But the flip-flop 347 once again changes its state when the following firing pulse $a_2$ appears in the line 332 (that is to say after the pulse $C_2$). There finally results, after inversion in the inverter 349, a signal which has the shape of the curve PP of FIG. 7 and is applied to the input 7 of the shift register 369 so as to be stored therein. The pulse of the signal of curve PP may be termed a "marker pulse".

Consequently, the same signal (curve QQ) is obtained at the output 5 of the register 369. Note that the firing pulses $a_3$ and $a_4$ can no longer pass through the flip-flop 347 since the latter remains in the state it assumed after application of the pulse $a_2$.

The firing pulse $a_1$ of the line 332 also reaches the input of the flip-flop 353 through the flip-flop 347, the inverter 349 and the selecting circuit 383. Consequently, this flip-flop is triggered by this pulse which brings the output 355 to the low level (curve SS). This information is thereafter stored and kept by the D-type latch 356 at the moment when the inverted pulse $C_2$ appears and is applied to its input Ck (curve TT). Therefore, there appears at the output of the flip-flop 356 a transition to the high level produced by this pulse $C_2$ (curve UU). The signal of the output $\overline{Q}$ of the flip-flop 356 therefore indicates whether there is or is not a firing pulse between the pulses $C_1$ and $C_2$. However, during the storing step, the flip-flop 353 is reset to its initial state at the start of the following cycle by the appearance of the pulse $C_1$.

As long as the speed of rotation of the shaft is below the previously-fixed threshold, the cycle just described occurs during each revolution of the shaft 1, the relative angular positions $C_1$, $C_2$ and $a_1$ to $a_4$ being unmodified (it will be understood that the time relations of the pulses representing them are also unmodified).

However, if the limit or threshold speed is exceeded, the signal in the line 306 triggers the operational amplifier 365 whose output triggers the flip-flop 367 in such manner that the output $\overline{Q}$ of the latter changes to the low level (transition of the curve RR of FIG. 7). Consequently, the measuring step is initiated, in the course of which the pulse $a_1$ must no longer have any influence on the device, merely the pulse $a_2$ being taken into account.

The output $\overline{Q}$ is applied to the input 3 of the shift register 369 for storing the information which flowed therein up till now, that is to say the signal of curve QQ of FIG. 7. The output $\overline{Q}$ of the D-type latch 367 is also applied through the line 368 to the input y of the selecting circuit 383 which no longer allows through the pulse which reaches its input x from the inverter 349, but, on the contrary, that which is applied to its input z connected to the output 1 or 5 of the register 369. The output $\overline{Q}$ is also applied to the base of the transistor $T_1$ but as it is henceforth at the low level, the operation of the transistor 376 is no longer determined by this signal but by that which reaches it from the junction 370 and is controlled by the change in state of the flip-flop 353 and the D-type latch 356.

The output $\overline{Q}$ of the D-type latch 367 is applied to the gate 335 through the line 370, which stops the passage of the pulse $C_2$ through this gate 335. Consequently, the D-type latch 356 can no longer record the change in level of its input D in the absence of the control signal at its input Ck, its output $\overline{Q}$ consequently remaining at the high level (curve VV).

As the shaft 1 rotates at a higher speed, it produces an offsetting in time between the firing pulses $a_1$ and $a_2$ stored in the register 369 during the storage step and the firing pulses $a'_1$ and $a'_2$ which have, owing to the operation of the distributor A, a certain advance in time. As already mentioned, the first case considered consists in taking into account for the measurement only the firing pulse which immediately follows in time the pulse $C_2$ in the course of each revolution of the shaft 1. Consequently, in the course of the measurement, any firing pulse, whether it be stored previously or instantaneously, must be rendered inoperative. This is achieved in the following manner.

As soon as the pulse $C_1$ appears, the flip-flop 353 changes state and modifies the logic level of the junction 360 (curve WW). Consequently, a delay is produced in the safety delay circuit 362 by the capacitor 373 and the transistor 376. Up to the end of the delay period, a pulse is applied to the input z of the flip-flop 344 which produces an inhibition signal at its output (curve XX). This signal maintains the state of the flip-flop 347 so that when the firing pulse $a'_1$ reaches the input y of this flip-flop, the latter cannot change state and the pulse $a'_1$ can no longer pass through. However, the suppression of the inhibition brought about by the resetting of the flip-flop 353 to its initial state by the pulse $a_1$ which reaches it from the shift register 369 after the appearance of the pulse $a'_1$, triggers, at the end of the delay period due to the circuit 362, an unblocking of the flip-flop 347 which will then be able to allow through the pulse $a'_2$ after which it will change state and no longer allow through the firing pulses $a'_3$ and $a'_4$ during the remainder of the considered cycle.

Consequently, when the pulse $a'_2$ reaches the flip-flop 347 the latter changes state and transfers this pulse to the gate 350 which is then/opened until it receives the initial firing pulse $a_1$ from the shift register 369 (curves YY and ZZ). The time during which this gate 350 is open is therefore a measurement of the angular evolution of the pulse a during the rotation of the shaft 1. Thus, it is sufficient to measure the length of the pulse at the output 375 to obtain the desired result.

Note that the operation of the safety delay circuit 362 ensures that the inhibition of passage through the flip-flop 347 continues for a certain time in order to avoid any disturbance which might result from an irregularity with respect to time of the firing pulses $a'_1$ due, for example, to a pronounced defect in the ignition distributor being tested.

Note also that the delay introduced in the suppression of the inhibition of the passage of the pulse $a'_1$ through the flip-flop 347 varies as a function of the speed of rotation of the shaft 1, the capacitor 373 being charged at a rate which increases with this speed.

In the second case considered hereinbefore, that is to say when no firing pulse occurs between the pulses $C_1$ and $C_2$ (FIG. 8), the circuit is put into the state for storing during the appearance of the pulses $C_1$ and $C_2$ so that the firing pulse which occurs immediately after the pulse $C_2$ is stored in the register 369.

The passage between the storage step and the measuring step occurs in the same way as described hereinbefore. However, as no firing pulse is received during the storage step for triggering the flip-flop 353 after the appearance of the pulse $C_1$, the D-type latch 356 stores no signal when the pulse $C_2$ appears and its output $Q$ will therefore be permanently at the low level. Consequently, the safety circuit 362 is inoperative and the inhibition of the passage through the flip-flop 347 is suppressed. The measurement of the offset between the firing pulses is carried out in the same way as described before for the case 1.

Having now described my invention what I claim as new and desire to secure by Letters Patent is:

1. An apparatus for testing the operation of a device controlling the ignition of an internal combustion engine, such as an ignition distributor or an injection pump, and adapted to produce ignition initiating signals for said engine, comprising:

means for driving said device in rotation and simulating the drive thereof in normal operation;

an angular encoder mechanically coupled to the driving means, said encoder being capable of producing a train of clock pulses the frequency of which pulses is a function of the speed of rotation of said driving means, and capable of producing by revolution of said driving means a pair of successive locating pulses which are synchronized with the clock pulses;

means for producing from said ignition initiating signals initiating oulses representing said signals;

a measuring circuit for producing pulses the duration of which represents the evolution with respect to time of the occurrence of said ignition initiating signals in the course of each revolution of said driving means, said measuring circuit comprising:

means for establishing a first operational step and a second operational step of said measuring circuit, each of said operational steps respectively corresponding to a predetermined speed of said driving means;

memory means capable in the course of the first operational step of storing at least a pulse representing an ignition initiating signal immediately following on a second of said locating pulses;

output means for producing a measurement pulse constituting the relation with respect to time between said pulse stored in said memory means and the initiating pulse measured in the course of said second operational step;

and a display device connected to said measuring circuit for displaying a value representing the length of said measurement pulse.

2. An apparatus as claimed in claim 1, wherein said memory means comprise an inhibition circuit connected to receive said locating pulses and said initiating pulses representing said ignition initiating signals, said inhibition circuit being capable of inhibiting, for the purpose of measuring said relation with respect to time in the course of said second operational step, the storage of the initiating pulses appearing during an interval of time between the locating pulses.

3. An apparatus as claimed in claim 2, wherein said inhibition circuit comprises a first multivibrator having inputs and an output, means for applying said locating pulses to said inputs, a second multivibrator having a first input connected to said output and a second input which receives said initiating pulses, a memory circuit being connected to said second input which is connected to said display device.

4. An apparatus as claimed in claim 2, further comprising a third multivibrator in the form of a flip-flop having an output and inputs, means for applying to said inputs a first of said locating pulses and the output signal of said inhibition circuit, said flip-flop being capable of detecting, for each revolution of said shaft, whether there is an initiating pulse in the interval between the locating pulses, and an auxiliary D-type latch connected to the output of said third flip-flop and receiving said second locating pulse so as to be capable of storing the information issuing from said third flip-flop, and D-type latch being synchronized with said second locating pulses for storing.

5. An apparatus as claimed in claim 3 or 4, comprising a marking circuit connected to receive said clock pulses and said initiating pulses synchronized with the clock pulses and to deliver in synchronism with the occurrence of said pulses representing said ignition initiating signals a marking pulse having a duration equal to one clock period, and means applying said marking pulse to said memory circuit.

6. An apparatus as claimed in claim 5, wherein said marking circuit comprises a circuit for synchronizing said initiating pulses with the clock pulses, said synchronizing circuit having an output and capable of delivering at its output for each of said initiating pulses a signal commencing with the occurrence of an initiating pulse and terminating at the end of the immediately following clock pulse, and means for applying said signal to said second multivibrator for transmission to the input of said memory circuit.

7. An apparatus as claimed in claim 6, comprising an inhibition circuit capable of inhibiting the taking into account of the initiating pulse during an interval between the first locating pulse and the occurrence of said marking pulse, said inhibition circuit being connected to receive the first locating pulse and the output signal of said memory circuit and to deliver an inhibition signal to said first multivibrator, an enabling device connected between the output of said D-type latch and said first multivibrator and capable of suppressing the inhibition produced by said inhibition circuit when the output of said first multivibrator delivers a signal corresponding to the absence of initiating pulses between the locating pulses during said first operational step for storing.

8. An apparatus as claimed in claim 7, comprising a safety delay circuit associated with said inhibition circuit and connected to said first multivibrator for delaying the suppression of said inhibition and comprising means for varying the delay in accordance with the speed of rotation of said shaft, whereby the phase shift angle between the suppression of the inhibition and the transmission of said suppression of said inhibition to said first multivibrator is constant irrespective of the speed of rotation of the shaft.

9. An apparatus as claimed in claim 1, 2 or 3, wherein said memory circuit is a shift register.

10. An apparatus as claimed in claim 1, further comprising a second measuring circuit for producing pulses each one of which pulses represents by its duration the time during which said device delivers its ignition initiating signal for each revolution of said driving means, said second measuring circuit being connected to said display device.

11. An apparatus as claimed in claim 1, wherein said control device is capable of furnishing a plurality of simultaneous ignition initiating signals in the course of each revolution of said driving means, said apparatus further comprising a third measuring circuit for producing pulses each one of which pulses represents by its duration the extent of synchronization of the pulses representing said ignition initiating signals, said third measuring circuit being connected to said display circuit.

12. An apparatus as claimed in claim 1, 10 or 11, comprising a scale converting circuit interposed between said display device and at least one measuring circuit for displaying the number of clock pulses occurring per revolution during a pulse produced by said measuring circuit, said encoder furnishing a number of pulses equal to $2^X$ and said converting circuit comprising a logic gate having a first input connected to said measuring circuit so that said gate is enabled to open only for the duration of each pulse that it produces, the logic gate having a second input connected to said encoder so as to allow through clock pulses during said duration and at least a third input, a calculating circuit connected to the third input of the logic gate and also connected to said encoder and capable of producing from the clock pulses it receives a number of correcting pulses inhibiting the opening of said logic gate a number of times during said duration, whereby the number of clock pulses passing through said logic gate is related to a scale of angular degrees or percentage, said converting circuit further comprising a selecting circuit for selectively providing a read-out in degrees and a read-out in percentages on said display device.

13. An apparatus as claimed in claim 12, comprising a first calculating gate and a second calculating gate, said calculating circuit comprising a binary counter having an input connected to said encoder and a first group of terminals connected to said first calculating gate and a second group of terminals connected to said second calculating gate, the second calculating gate having an output connected to an additional input of the first calculating gate, the first calculating gate having an output connected to said logic gate.

14. An apparatus as claimed in claim 13, wherein said number of clock pulses per revolution is equal to 1,024, said counter comprising twelve binary outputs and an input which receives 512 pulses per revolution, said first calculating gate being connected through a first input to said input of the counter and through a second input and a third input to outputs of said counter, said second calculating gate comprising five inputs respectively connected to outputs of said counter whereby said first calculating gate delivers to said gate 124 inhibition pulses per revolution, means being provided which are connected to the output of said counter for enabling said display device to display the results of the measurement only after the expiration of a duration equal to four revolutions of said driving means.

15. An apparatus as claimed in claim 12, comprising a third calculating gate having an output and inputs, and a correcting gate, said calculating circuit comprising a binary counter having an input connected to said encoder and a group of outputs connected to respective ones of said inputs of said third calculating gate, the third calculating gate comprising an additional input connected to said correcting gate which has two inputs a first of which inputs is connected to an additional output of said counter and a second of which inputs is connected to said encoder, the output of said third calculating gate being connected to said logic gate.

16. An apparatus as claimed in claim 15, wherein said number of clock pulses per revolution is equal to 1,024, said counter has at least six outputs and an input which input receives 512 pulses from said encoder and said third calculating gate is connected by four of its inputs respectively to the outputs of said counter, and said first output of said correcting gate is connected to the output of said counter.

17. An apparatus as claimed in claim 1, 10 or 11, further comprising a frequency divider circuit connected between at least one measuring circuit and said display device for correcting for each revolution of said driving means a number of measurement pulses in accordance with the number of cylinders of an internal combustion engine for which said control device is intended.

18. An apparatus as claimed in claim 1, 10 or 11, comprising a second display device for displaying digital parameters relating to the operation of said control device, a frequency divider connecting said second display device to said encoder for displaying the speed of rotation of said driving means.

19. An apparatus as claimed in claim 18, for a device controlling the ignition delivering a plurality of ignition initiating signals per revolution of said driving means, said apparatus further comprising a fourth measuring circuit for producing a measurement signal which is a function of the distribution with respect to time of said measurement signal in one revolution of said driving means, a voltage/frequency converter connecting said measuring means to said second display device.

20. An apparatus as claimed in claim 18, for an ignition control device comprising an electric contact breaker having contacts for producing electric ignition initiating pulses, said apparatus further comprising means for producing a measurement signal which is a function of the resistance between the contacts of said contact breaker, a voltage/frequency converter connecting said measuring means to said second display device.

21. An apparatus as claimed in claim 19, wherein said fourth measuring circuit comprises a counter having an input connected to said encoder, a circuit which is capable, in response to each pulse representing said ignition initiating signals, of producing two successive initiating pulses, a memory connected to the outputs of said counter, means for applying a first of the successive initiating pulses to an input triggering said memory for producing the storage of the contents of said counter, means for applying the second initiating pulse to a resetting input of said counter, a digital-analog converter connected to the outputs of said memory and having an output connected to said second display device, the time for completely filling said counter providing a reference time interval for intervals between the successive ignition initiating signals.

22. An apparatus as claimed in claim 21, comprising a frequency divider circuit having a variable division factor connecting said encoder to said counter.

23. An apparatus as claimed in claim 21, wherein the capacity of the counter, and consequently the ratio between the reference interval and the period of the encoder, is so chosen that the numbers obtained at the outputs of the counter for identical values obtained on each side of the instant of the end of the reference interval are complementary therebetween.

24. An apparatus as claimed in claim 21, wherein said memory comprises a series of direct outputs delivering the real number stored and a series of complementary outputs delivering the complement of the binary number stored, said digital-analog converter comprising conversion enabling circuits connected to be controlled by the outputs of the most significant bits which are direct and complementary.

25. An apparatus as claimed in claim 24, wherein said digital-analog converter comprises two operational amplifiers each provided with a network of resistors which are respectively connected to corresponding outputs of said memory and to one of the inputs of each corresponding amplifier and the direct and complementary outputs of the most significant bits are connected to other inputs of said operational amplifiers.

26. An apparatus as claimed in claim 25, comprising peak detecting networks having outputs connected to an adding point connected to said display device, the outputs of said operational amplifiers being respectively connected to the peak detecting networks.

* * * * *